United States Patent [19]
Austin et al.

[11] Patent Number: 5,387,126
[45] Date of Patent: Feb. 7, 1995

[54] CONFIGURABLE CIRCUIT SUBSTRATE

[75] Inventors: Michael M. Austin, Pompano Beach; Steven R. Fischl, Sunrise; Mark S. Bresin, Coral Springs; Alay Mehta, Plantation; Raymond J. Kleinert, III, Ft. Lauderdale; Willard F. Amero, Jr., Plantation, all of Fla.

[73] Assignee: Motorola, Inc., Schaumburg, Ill.

[21] Appl. No.: 106,670

[22] Filed: Aug. 16, 1993

[51] Int. Cl.⁶ .............................................. H05K 1/00
[52] U.S. Cl. ................................. 439/516; 174/254
[58] Field of Search .................. 439/55, 516, 77; 29/847; 174/254

[56] References Cited

U.S. PATENT DOCUMENTS

| | | | |
|---|---|---|---|
| 3,873,889 | 3/1975 | Leyba | 439/77 |
| 4,592,606 | 6/1986 | Mudra | 439/516 |
| 4,990,724 | 2/1991 | Suppelsa et al. | 174/261 |
| 5,032,737 | 7/1991 | Holm et al. | 174/254 |
| 5,112,230 | 5/1992 | DeSimone | 439/55 |

OTHER PUBLICATIONS

IBM Technical Bulletin, vol. 20, No. 5, p. 1932, Burns et al., Oct. 1977.

Primary Examiner—Neil Abrams
Attorney, Agent, or Firm—Andrew S. Fuller

[57] ABSTRACT

A configurable flexible circuit substrate (100) is disclosed. The substrate (100) has an electrical circuit pattern (120) and an integral separable segment (130) containing a portion (132) of the circuit pattern (120). The substrate (100) also includes an integral extraction initiator portion (132), which is pivotable between a first position substantially planar with the surface of the substrate (100), and a second position away from the surface of the substrate (100). The extraction initiator portion (132) develops stress raisers (137) when pivoted toward the second position, and the extraction initiator portion (132) also effects a removal of the separable segment (130) from the substrate (100) when the extraction initiator portion (132) is pulled across the separable segment (130).

14 Claims, 2 Drawing Sheets

200

300

1

CONFIGURABLE CIRCUIT SUBSTRATE

TECHNICAL FIELD

This invention relates in general to circuit substrates, and in particular, to circuit substrates which are configurable.

BACKGROUND

Product manufacturers have increasingly turned to flexible manufacturing in the effort to reduce costs and increase efficiency. Flexible manufacturing typically involves the production of the multiple variations of a product on a single assembly line. For electronic products, product differentiation usually includes modifications of the behavior of electronic circuitry used in the product, and in many instances, the difference in electronic circuitry among various product models is minor. In some applications, such modifications are accomplished by programming programmable components within the circuit. In other applications, the circuit must be physically modified by adding or removing components or portions of the circuitry.

Physical modifications of circuits can be attractive for certain applications where only minor circuit modification is required. For example, this approach can be cost effective if the manufacturer can build or purchase large quantities of circuits of a given configuration, such as the configuration used in the most popular product model. The manufacturer could take advantage of quantity discounts, while being able to convert the circuit for lower volume models by altering a portion of the circuit. This approach has been successfully used for circuits implemented on flexible circuit substrates in which a segment of the substrate containing a portion of the circuitry is removed to alter the behavior of the circuitry. The segment removed may be as simple as an electrical conductor, electrically connecting two areas on the substrate.

In a typical manufacturing operation, the removal of segments from flexible circuit substrates to modify circuit behavior is accomplished using a device incorporating a hole punching mechanism. The use of hole punching devices for circuit modification has several consequences for the manufacturing process. First, it is usually necessary to perform the hole punching step before the installation of the circuit substrate as it would be cumbersome to do otherwise. Second, the hole punching device occupies manufacturing space, and multiple configurations may be required to handle circuit substrates with different geometries. Third, these devices may be costly to implement, operate, and maintain.

The benefits of having easily modifiable circuits have been recognized and exploited. However, there exists a need in the art to have a more efficient and cost effective solution to circuit modification.

SUMMARY OF THE INVENTION

Briefly, in accordance with the invention, a configurable flexible circuit substrate is disclosed. The substrate has an electrical circuit pattern and an integral separable segment containing a portion of the circuit pattern. The substrate also includes an integral extraction initiator portion, which is pivotable between a first position substantially planar with the surface of the substrate, and a second position away from the surface of the substrate. The extraction initiator portion develops stress raisers when pivoted toward the second position, and the extraction initiator portion also effects a removal of the separable segment from the substrate when the extraction initiator portion is pulled across the separable segment.

DETAILED DESCRIPTION OF THE EMBODIMENTS

Figure 1:
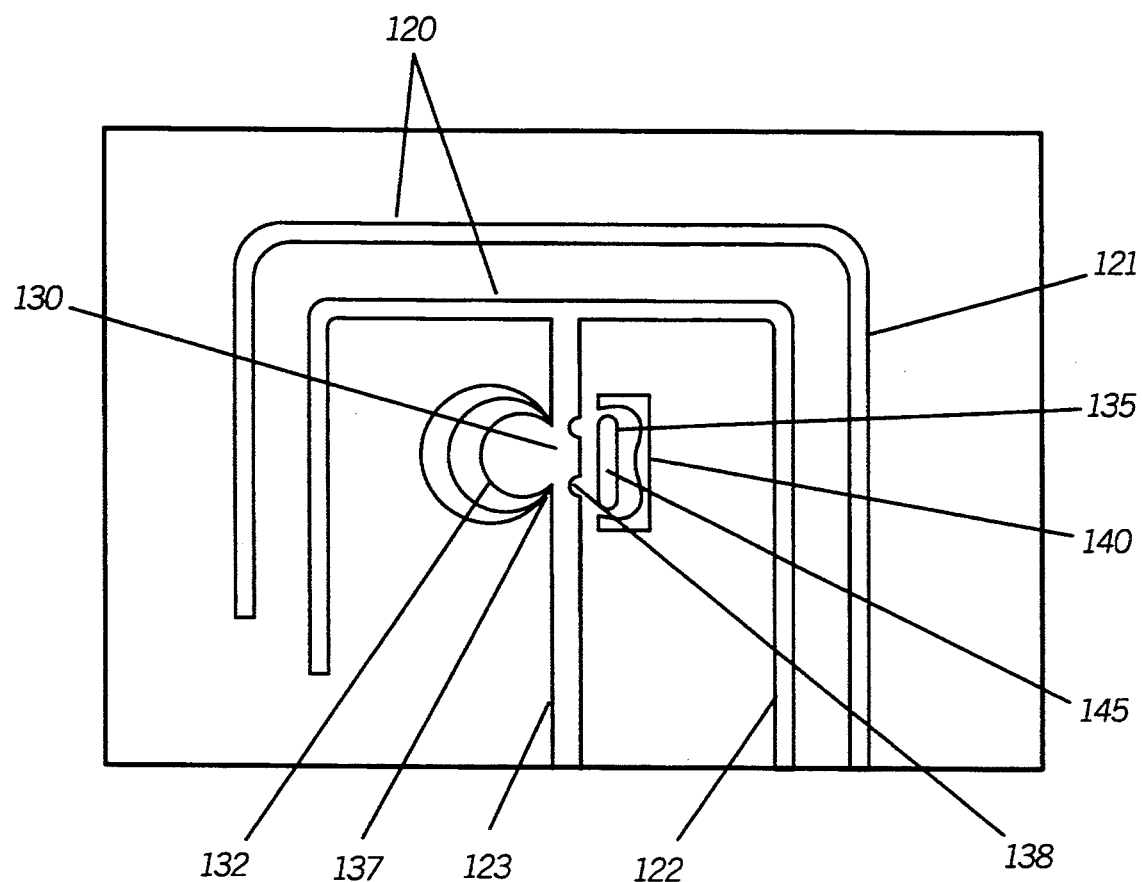
FIG. 1 is flexible circuit substrate having an integral circuit modification means, in accordance with the present invention.

Referring to FIG. 1, a configurable circuit substrate 100 is shown, in accordance with the present invention. The substrate 100 is thin and flexible, and is commonly referred to as a flexible circuit substrate. The substrate 100 is formed from polyester, polyimide, or other suitable material commonly used for flexible circuit substrates, and is formed to have a planar surface. The substrate 100 houses an electrical circuit pattern 120 which may include an electrical conductor or a system of electrical conductors through which an electric current is intended to flow. The substrate 100 may also include other circuit elements electrically coupled to the conductor(s). According to the invention, the circuit pattern 120 is configurable by physical modification of the substrate 100, in which the electrical circuit pattern 120 on the substrate 100 is altered by physically removing a segment of the circuit pattern 120.

The substrate 100 comprises a circuit modification mechanism, integral to the substrate 100, for physical modification of the circuit pattern 120. This mechanism includes a separable segment 130 in the form of a tear area containing a portion of the electrical circuit pattern 120. The separable segment 130 can be removed from the substrate 100, to effect a predetermined modification to the circuit pattern. The separable segment 130 contains a single electrical conductor 123 electrically interconnecting two portions of the electrical circuit pattern 120 on the substrate 100. However, the separable segment 130 may contain more complex circuitry implementing a variety of functions. Several segments may be included on a substrate 100 to expand configuration options. Circuit modification is accomplished using a segment extraction aid 132,135, integral to the substrate 100, which facilitates the removal of the separable segment 130 from the substrate 100. The extraction aid 132,135 is designed to be self-contained, and to be operable by hand, thereby obviating the need for tools to effect the circuit pattern alteration.

The design of the built-in extraction aid 132,135 directly impacts the effectiveness of the extraction aid 132,135. In the preferred embodiment, the extraction aid 132,135 comprises a tab 132, adjacent to the separable segment 130, and a tear stop 135, also adjacent to the separable segment 130 but opposite to the tab 132. The tab 132 is the extraction initiator portion and is formed about the separable segment 130 from substrate material. The tab 132 can be formed by removing substrate material, such as by excision or the like, to define the shape of tab 132. Preferably, the tab 132 is sufficiently large to be graspable by hand. As the tab 132 is made from substrate material, the tab 132 is flexible, and is pivotable between a position substantially planar with the surface of the substrate 100, to a position away from the surface of substrate 100. Additionally, in the preferred embodiment, the tab 132 is C-shaped to produce a sharp corner at two points along the separable segment 130. This configuration creates a stress raiser, or stress concentrator 137, at the juncture between the tab 132 and the separable segment 130, which concentrates mechanical stresses toward the separable segment 130 when the tab 132 is pulled toward the separable segment 130. Pivoting the tab 132 away from the planar surface of the substrate 100 develops the stress raisers 137 and induces a mechanical stress through the stress raisers 137 toward the separable segment 130. The preferred embodiment also includes stress raisers on the separable segment 130 in the form of notches 138 on the electrical conductor 123. A force sufficient to remove the tab 132 from the substrate 100 will also cause removal of the separable segment 130.

The tear stop 135, located adjacent to the separable segment 130 and opposite to the tab 132, comprises a cavity 145 within the substrate 100 about the separable segment 130. The tear stop 135 functions as the extraction terminator. The cavity 145 dissipates the mechanical stresses induced in the substrate 100 by the removal of the tab 132 and separable segment 130, thereby preventing damage to the portion of the substrate 100 which surrounds the separable segment 130. Note that no tear stop is necessary if the separable segment 130 is adjacent to the edge of the substrate 100. The tear stop 135 is buttressed by a reinforced area 140 adjacent to the cavity 145. This reinforced area 140 can be formed from conductor material not connected to the circuit pattern 120.

Figure 2:
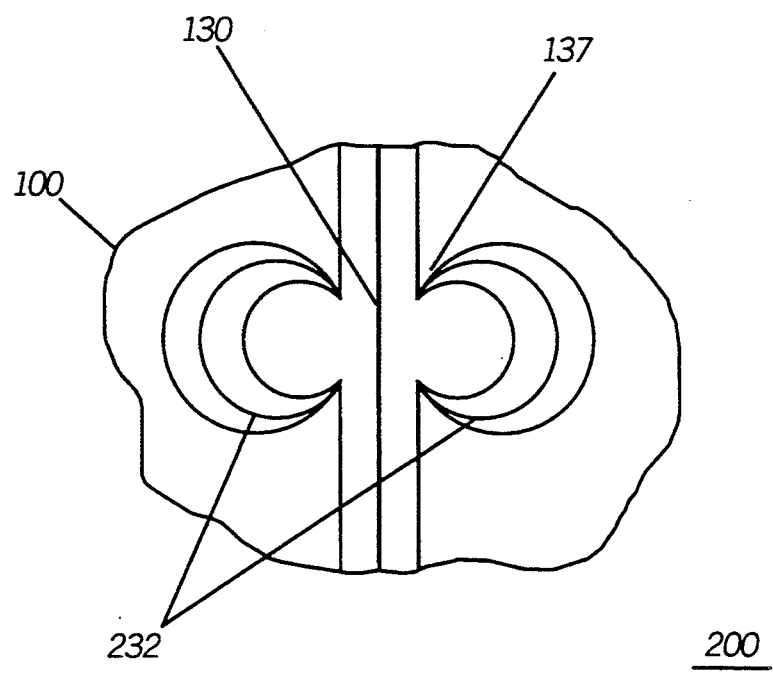
FIG. 2 is a second embodiment of the circuit modification means, in accordance with the present invention.

Referring to FIG. 2, an alternative design 200 of the circuit modification means is shown, in accordance with the present invention. In this embodiment, two C-shaped tabs 232 extend on opposite sides of the separable segment 130, both having sharp corners which form stress raisers 137 at the juncture between each tab 232 and the separable segment 130. To remove the separable segment 130, both tabs 232 are brought together to form a clasp, which is then pulled to remove the segment 130. The use of two tabs 232 may reduce the risk of damage to the surrounding substrate 100, but may require more implementation space when compared to a single tab implementation.

Figure 3:
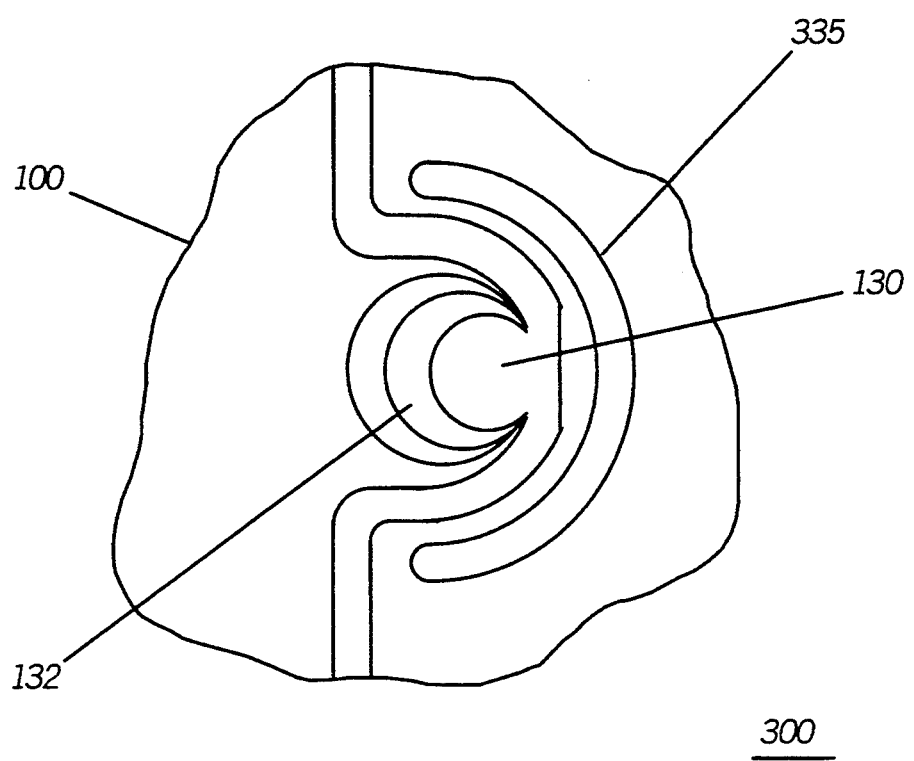
FIG.3 is third embodiment of the circuit modification means in accordance with the present invention.

Referring to FIG. 3, an alternative design 300 of the circuit modification means is shown in accordance with the present invention. Here, the separable segment 130 is offset from the remainder of the circuit pattern and is shaped to receive the tab 132 or a portion thereof. The shape of the separable segment 330 combines with that of the tear stop 335, which traces the shape of the separable segment 330, to help reduce the risk of damage to the remaining substrate 100.

In accordance with the present invention, the configurable circuit substrate 100 with integral circuit modification means offers several advantages. Circuit modification can be accomplished without the use of tools or devices, thus avoiding the associated costs for implementation, operation, and maintenance. For example, to alter the circuit pattern 120, the tab 132 is pivoted to a position away from the plane of the substrate, then pulled toward the separable segment 130 and removed. The separable segment 130 is removed with the removal of the tab 132. Moreover, the circuit substrate 100 may be modified even after installation into an assembly, thereby increasing manufacturing flexibility. Hence, use of the configurable circuit substrate 100 can result in an improvement in manufacturing efficiency and a reduction in manufacturing costs.

What is claimed is:

1. A configurable circuit, comprising:
   a flexible substrate having an electrical circuit pattern;
   a separable segment integral to said substrate, said separable segment containing a portion of said circuit pattern;
   an extraction initiator portion integral to said substrate, said extraction initiator portion being pivotable between a first position and a second position; and
   an extraction terminator portion located adjacent to said separable segment and opposite to said extraction initiator portion, and comprising a reinforced area of said substrate about said separable segment having a higher tolerance for mechanical stress than portions of said substrate about said reinforced area.

2. A configurable circuit as defined in claim 1, wherein said extraction initiator portion is sufficiently large to be graspable by hand when said extraction initiator portion is in said second position.

3. A configurable circuit as defined in claim 1, wherein said extraction initiator portion comprises a tab with a juncture immediately adjacent to said separable segment.

4. A configurable circuit as defined in claim 3, wherein said juncture has integral stress raisers for inducing mechanical stress toward said separable segment when said tab is removed.

5. A configurable circuit as defined in claim 1, wherein said extraction terminator portion comprises an area of said substrate about said separable segment having a cavity therein.

6. A configurable circuit as defined in claim 1, wherein said extraction initiator portion develops stress raisers for directing a force toward said separable segment when said extraction initiator portion is pivoted toward said second position, and said extraction initiator portion effects a removal of said separable segment from said substrate when said extraction initiator portion is pulled across said separable segment.

7. A configurable circuit, comprising:
   a flexible substrate having an electrical circuit pattern;
   a separable segment integral to said substrate, said separable segment containing a portion of said circuit pattern; and
   an extraction initiator portion integral to said substrate, said extraction initiator portion comprising two tabs on opposite sides of said separable segment, each tab having a juncture adjacent to said separable segment;
   wherein said tabs are pivotable between a first position and a second position, said tabs developing stress raisers for directing a force toward said separable segment when said tabs are pivoted toward said second position, and said tabs effecting a removal of said separable segment from said substrate when said tabs are pulled across said separable segment.

8. A configurable circuit, comprising:

a flexible circuit substrate having an electrical circuit pattern;

a tab integral to said substrate;

a tear area on said substrate adjacent to said tab;

an electrical conductor traversing said tear area and establishing an electrical connection between portions of said electrical circuit pattern;

said tear area being selectively severable, thereby breaking said electrical connection; and a tear stop integrally formed on said substrate. said tear stop being adjacent to said tear area and opposite to said tab, said tear stop comprising a reinforced area of said substrate about said tear area, said reinforced area having a higher tolerance for mechanical stress than portions of said substrate about said reinforced area.

9. A configurable circuit as defined in claim 8, wherein:

said substrate has a planar surface;

said tab is flexible between a first position substantially planar with said planar surface, and a second position away from said planar surface.

10. A configurable circuit as defined in claim 8, wherein said substrate has stress raisers about said tear area for directing force applied to said tab toward said tear area.

11. A configurable circuit as defined in claim 8, wherein said tear stop comprises an area of said substrate having a cavity therein.

12. A configurable circuit, comprising:

a flexible substrate having an electrical circuit pattern;

a separable segment integral to said substrate, said separable segment containing a portion of said circuit pattern;

an extraction initiator portion integral to said substrate, said extraction initiator portion being pivotable between a first position and a second position, and inducing stress raisers when pivoted to the second position; and an extraction terminator portion located adjacent to said separable segment and opposite to said extraction initiator portion, and comprising a cavity extending along said separable segment.

13. A configurable circuit as defined in claim 12, wherein the separable segment is shaped to receive the extraction initiator portion.

14. A configurable circuit as defined in claim 12, wherein the separable segment and extraction terminator portion are C-shaped.

* * * * *